United States Patent [19]

Wanuga et al.

[11] 4,442,574
[45] Apr. 17, 1984

[54] FREQUENCY TRIMMING OF SAW RESONATORS

[75] Inventors: Stephen Wanuga; Wendell M. T. Kong, both of Liverpool; Cleo M. Stearns, Jamesville, all of N.Y.

[73] Assignee: General Electric Company, Syracuse, N.Y.

[21] Appl. No.: 402,025

[22] Filed: Jul. 26, 1982

[51] Int. Cl.³ .................................... H01L 41/22
[52] U.S. Cl. ...................... 29/25.35; 219/121 LM; 310/312
[58] Field of Search .............. 29/25.35, 593; 310/312; 219/121 LM, 121 LH, 121 LJ

[56] References Cited

U.S. PATENT DOCUMENTS 3,766,616 10/1973 Standte ............................. 29/25.35
4,131,484 12/1978 Carnso et al. ..................... 310/312 X

OTHER PUBLICATIONS

Haydl, W. H. et al., "Fine Tuning of Surface-Acoustic-Wave Resonator Filters with Metallisation Thickness," *Electronics Letters,* Jun. 12, 1975, vol. 11, No. 12, pp. 252–253.

James, S., et al., "Fine Tuning of S.A.W. Resonators Using Argon Ion Bombardment," *Electronics Letters,* Oct. 11, 1979, vol. 15, No. 21, pp. 683–684.

Rosenfeld, R. C., et al., "Tuning Quartz SAW Resonators by Opening Shorted Reflectors," 1977 Proceedings of the Thirty-First Annual Frequency Control Symposium, pp. 231–239.

"MIRT Series 800 Mask Inspection and Repair Tool," Advertising Flyer, Quantronix Corporation, Smithtown, New York.

*Primary Examiner*—Carl E. Hall
*Attorney, Agent, or Firm*—Richard V. Lang; Carl W. Baker

[57] ABSTRACT

Surface acoustic wave devices with precisely set frequencies are produced by laser trimming metallization strips on the device while monitoring the device frequency and/or phase shift. The trimming strips may be metallizations added during device manufacture or after device manufacture, or they may include selected ones of the reflecting gratings.

7 Claims, 8 Drawing Figures

FREQUENCY TRIMMING OF SAW RESONATORS

BACKGROUND OF THE INVENTION

1. Field of the Invention

This invention relates to frequency trimming of surface acoustic wave resonators, and more particularly, to SAW resonators having a precisely set resonant frequency and a method for laser trimming of metallizations to produce the desired frequency characteristic in such devices.

2. Description of the Prior Art

Many applications of surface acoustic wave (SAW) devices require designs which yield a very precisely set frequency. One type of such devices is the SAW resonator which offers the potential for high frequency operation of narrowband filtering and oscillators for a variety of electronic systems, such as those used in both military and commercial systems for radio communication and radar signal processing. Although these resonators can be used in many systems that require frequency control and/or signal processing devices, of particular interest is the use of SAW resonators for filtering for a variety of mobile radio communication systems. In these devices, it is desirable to have enough flexibility in the design to provide a low cost, simple means of producing a small precise shift in frequency.

Several prior art techniques have been employed for fine tuning of SAW resonators. In a paper entitled "Fine Tuning of Surface Acoustic-Wave Resonator Filters with Metallization Thickness" by Haydl et al, *Electronics Letters*, June 12, 1975, Vol. 11, No. 12, pages 252–253, a technique of controlling the frequency of the resonator by controlling metallization thickness is described. This technique is somewhat cumbersome, since the entire crystal must be immersed in an acid etch to remove metallization, or the crystal must be placed in a vacuum chamber to add or remove metallization. Another prior art technique is that of using argon ion bombardment for fine tuning of SAW resonators, as reported in a paper titled "Fine Tuning of SAW Resonators Using Ion Bombardment," by James et al, in *Electronics Letters*, Oct. 11, 1979, Vol. 15, No. 21, pages 683–684. This technique requires the resonator sample to be placed in a chamber, where either a change in mass loading of the quartz surface or a change in impedance due to a difference in sputtering rates of aluminum and quartz is carried out. A prior art technique to trim SAW resonator center frequencies is described in a paper by Rosenfeld et al, entitled "Tuning Quartz SAW Resonators by Opening Shorted Reflectors," in the 1977 *Proceedings of the Thirty-First Annual Frequency Control Symposium*, pages 231–239. In this technique a laser is used to open-circuit grating fingers by etching to shift the device frequency upwards. Yet another prior art technique for frequency trimming uses a deposition or overlay of dielectric films to alter the electric field associated with the propagating surface waves. Control of deposition of dielectric films is difficult, because placing the entire device inside a vacuum chamber and deposition by sputtering is required. These requirements, along with controlling environmental factors, such as heat, complicates control of the process, making very precise frequency adjustment extremely difficult. None of these prior art techniques offers a very precise frequency shifting technique, and each of them requires extra equipment and processing steps adding complexity and cost to the manufacture of SAW devices.

SUMMARY OF THE INVENTION

An object of the present invention is to provide an accurate frequency trimming technique for SAW devices.

A more specific object of the present invention is to provide a technique for depositing narrow strips of metallization in the region within a SAW resonance cavity and controlling removal thereof to a precisely controlled extent by laser trimming to allow the manufacture of SAW devices having precisely set resonance frequencies.

Accordingly, in the technique of the present invention, strips of metallization are deposited in the gaps between the metallizations within a SAW resonance cavity, and while the resonance frequency is continuously monitored, the deposited metal strips are gradually removed by laser trimming until precisely the desired resonance frequency of the SAW device is produced. The present invention can be employed to frequency trim one port or two port SAW devices.

BRIEF DESCRIPTION OF THE DRAWINGS

The features of the invention believed to be novel and unobvious over the prior art are set forth with particularity in the appended claims. The invention itself, however, as to organization, method of operation and best mode contemplated by the inventors, may best be understood by reference to the following description taken in conjunction with the accompanying drawings, in which, like reference characters refer to like elements throughout, and in which:

DESCRIPTION OF THE PREFERRED EMBODIMENTS

Figure 1:
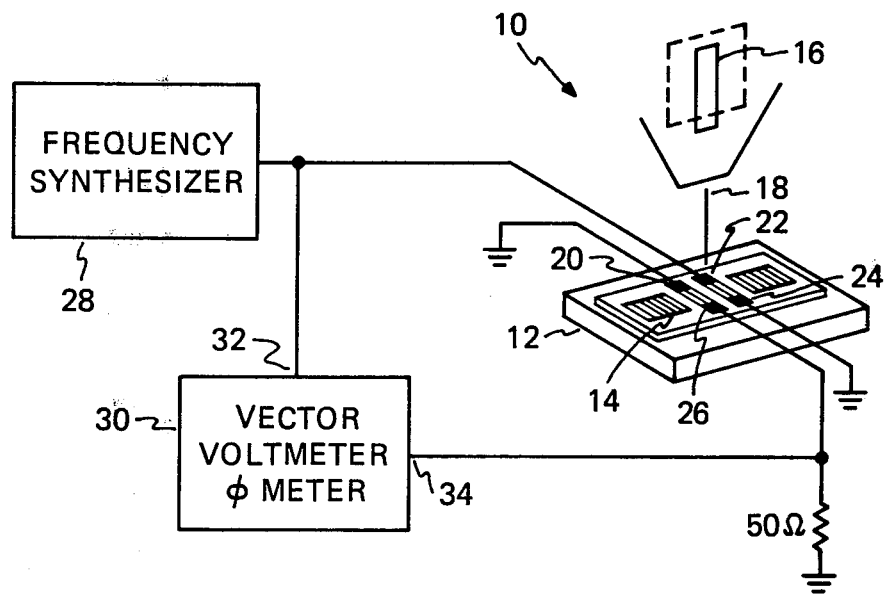
FIG. 1 is a schematic diagram illustrating the laser trimming and control apparatus used for the present invention.

FIG. 1 illustrates an exemplary laser trimming apparatus 10 for making the SAW devices of the present invention. A platform 12 for supporting a SAW resonator 14 to be trimmed is positioned beneath a laser source 16. Either the platform 12 or the laser 16 may be movable to control the positioning of the laser beam 18 relative to the SAW resonator 14 during the trimming process. One terminal 22 of the SAW device 14 is connected to a frequency synthesizer 28 and one terminal 32 of vector voltmeter phase meter 30. Terminal 26 of device 14 is connected to the terminal 34 of phase meter 30. Terminals 20 and 24 of SAW device 14 are grounded during trimming. It will be readily understood by those skilled in the art that the terminals could be connected in a different pattern, e.g., terminal 26 to synthesizer 28 and terminal 32 of phase meter 30, terminal 24 to terminal 34, and terminals 20 and 22 to ground.

If a SAW device having a different terminal pattern is used, a suitable connection pattern would be used. It should be understood that the frequency synthesizer and phase meter functions could be replaced by a network analyzer.

Figure 2:
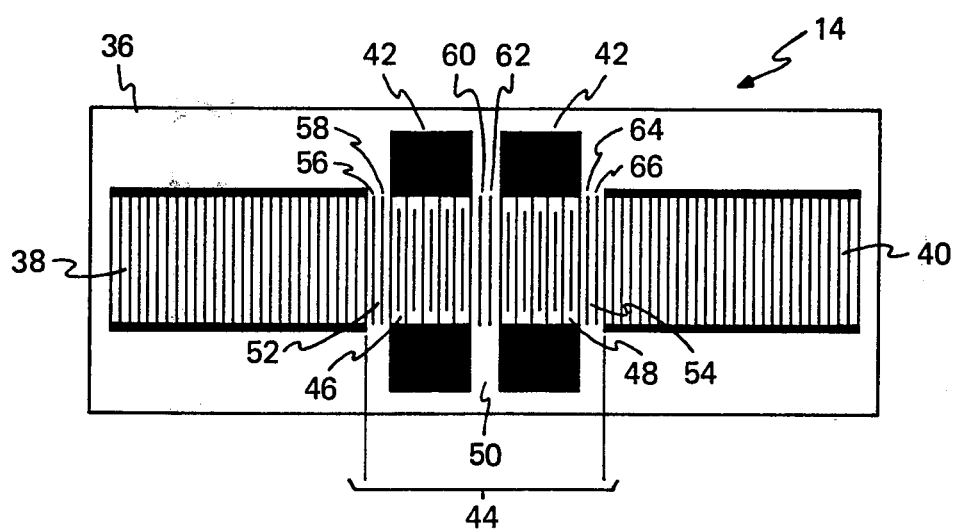
FIG. 2 is a schematic diagram illustrating the details of a SAW device including metallization strips for frequency trimming according to the present invention.

A SAW resonator having metallizations to be trimmed by the method of the present invention is shown schematically in FIG. 2. SAW device 14 includes a planar substrate 36 of a suitable insulating material, such as quartz, a pair of reflecting gratings 38 and 40 mounted upon one major surface of substrate 36, and two transducers 42 located in the resonator cavity 44. Transducer 42 comprises a pair of surface wave interdigital transducers 46, 48 separated by a gap 50, and separated from reflecting gratings 38, 40 by gaps 52, 54, respectively. Metal trimming strips 56, 58, 60, 62, 64 and 66 are deposited in the gaps within the SAW resonance cavity 44 either during the manufacture of the resonator 14 or afterward by a separate deposition technique.

Frequency trimming according to the present invention is performed by the apparatus 10 as follows. The SAW resonator 14 is mounted on the platform 12 of the trimming apparatus and connected to the frequency synthesizer 28 and vector voltmeter phase meter 30 as shown in FIG. 1. The resonance frequency of the SAW resonator 14 is measured by the frequency synthesizer 28, when a peak voltage amplitude is observed at terminal 34 of vector voltmeter 30. For this condition, the phase shift between terminals 32 and 34 of the vector voltmeter phase meter 30 is determined by the resonator design and measurement circuit impedance levels employed.

The desired operating frequency is then set on the frequency synthesizer 28, and trimming of the metallic trimming strips 56, 58, 60, 62, 64 and 66 is performed using the laser 16, until the vector voltmeter phase meter 30 reaches the proper phase shift, indicating that the desired operating frequency of the SAW resonator has been achieved. By using this technique very precisely set operating frequencies may be produced for SAW resonators. An alternate technique is to trim metallization from the trimming strips, and then adjust the frequency of the frequency synthesizer 28 until a peak voltage is observed on the vector voltmeter phase meter 30 indicating the operating frequency of the SAW resonator being trimmed. Thus, the combination of the frequency synthesizer 28 and the vector voltmeter phase meter 30 provides the means to accurately monitor the resonance frequency of a SAW device as it is being trimmed.

By placing narrow strips of metallization in the gaps 50, 52, 54 as described in the present invention, a small change in propagation velocity, equivalent to a change in the transducer/cavity separation, is produced, which provides a small shift in the SAW resonator resonance frequency. Monitoring the resonance frequency during laser trimming allows removal of the trimming strips to precisely the extent required to provide a desired center frequency of operation with a specified phase shift. This technique has the advantage that the trimming strips may be applied using the same mask used for the resonator fabrication or by conventional metal desposition techniques to already fabricated SAW resonators. During trimming the SAW resonator does not need to be immersed in any acid or placed in a vacuum system, thereby eliminating the need for complicated control equipment or any further cleaning of the resonator crystal following trimming. If a high energy laser is to be used, cooling of the substrate may be employed to prevent damaging it and yet allow a high trimming rate.

Figure 3:
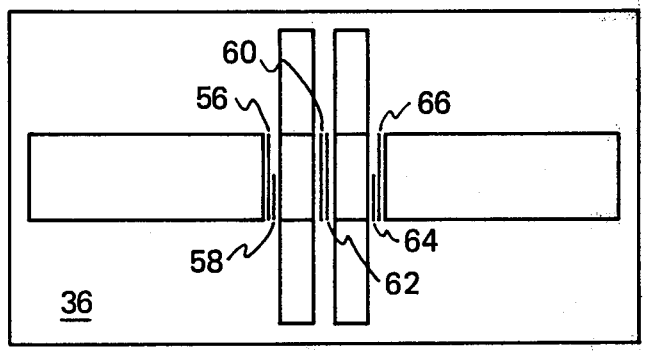
FIGS. 3–6 are schematic diagrams illustrating SAW devices having metallization trimming patterns produced by the present invention.
Figure 4:
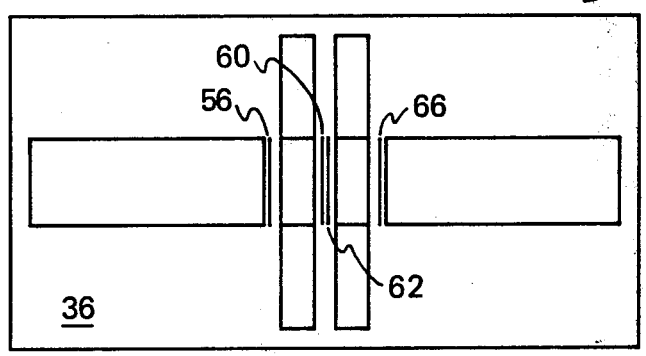
Figure 5:
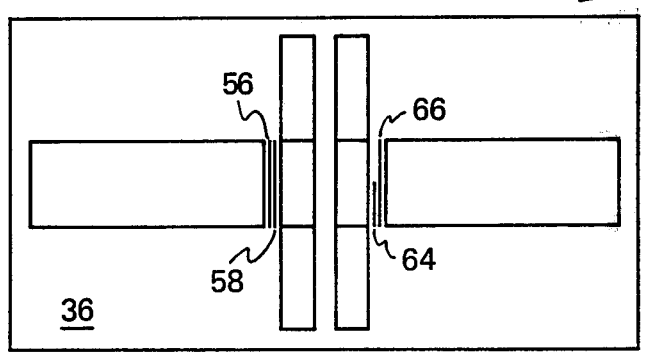
Figure 6:
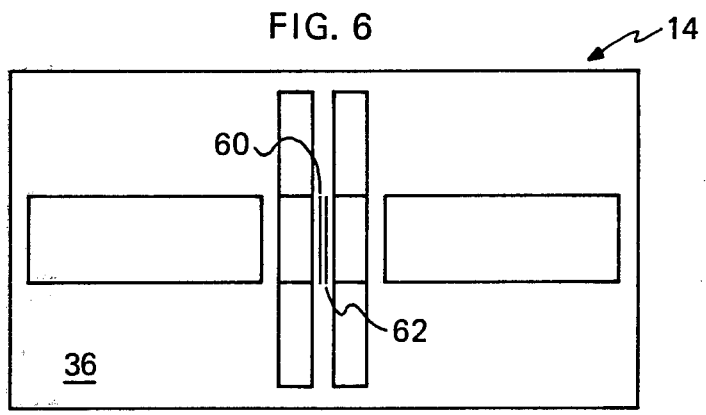

FIGS. 3-6 illustrate schematically some SAW devices having metallization trimming patterns produced by the present invention. In FIG. 3 a resonator having an initial resonance frequency $f_{o_i}$ of 151.416 MHz was trimmed by the partial removal of two trimming strips 58, 64 to produce a frequency change $\Delta f$ of 9.1 kHz, so that the resulting SAW resonator had a frequency $f_{o_f}$ of 151.4069 MHz. In the SAW resonator illustrated in FIG. 4 two strips 58, 64 were completely removed, which produced a frequency change $\Delta f$ of 13.1 kHz, changing the resonance frequency from $f_{o_i}$ of 151.441 MHz to a device resonance frequency of $f_{o_f}$ of 151.4279 MHz. The resonator shown in FIG. 5 had an initial frequency $f_{o_i}$ of 141.353 MHz, and following complete trimming of the two center trimming strips 60, 62 and partial trimming of a third trimming strip 64 of $\Delta f$ of 16.3 kHz was achieved producing a resonance frequency $f_{o_f}$ of 151.3367 MHz. In the resonator shown in FIG. 6 trimming strips 56, 58 and 64, 66 were completely removed, producing a $\Delta f$ of 27.1 kHz and changing the device resonance frequency from $f_{o_i}$ of 151.454 MHz to a frequency of $f_{o_f}=151.4259$ MHz. By removing all of the trimming strips (not shown) from a SAW resonator having an initial frequency of 151.447 MHz, a $\Delta f$ of 40.3 kHz was achieved producing a SAW resonance frequency of $f_{o_f}=151.4067$ MHz. In each case aluminum was deposited in strips one-quarter of the device acoustic wavelength wide and 3000 Å thick, and removal was with a Nd:YAG laser operating at a wavelength of about 1.06 microns. As shown by the sensitivity of the frequency adjustments in the examples, 0.1 KHz accuracy for 150 MHz devices, very precise frequency control is achievable with the present invention.

In each case described above, the SAW device comprised aluminum gratings deposited on a quartz substrate for the reflecting gratings and transducers, with aluminum trimming strips deposited in the gaps and trimmed to the extent required for a desired decrease in frequency. Other combinations, such as depositing other various metallic or insulating trimming strips for frequency trimming a SAW resonator, may be used and which could be used to shift the resonance frequency upwards. Therefore, the technique can be employed to produce either upward or downward shift of resonant frequency dependent upon the materials used.

Figure 7:
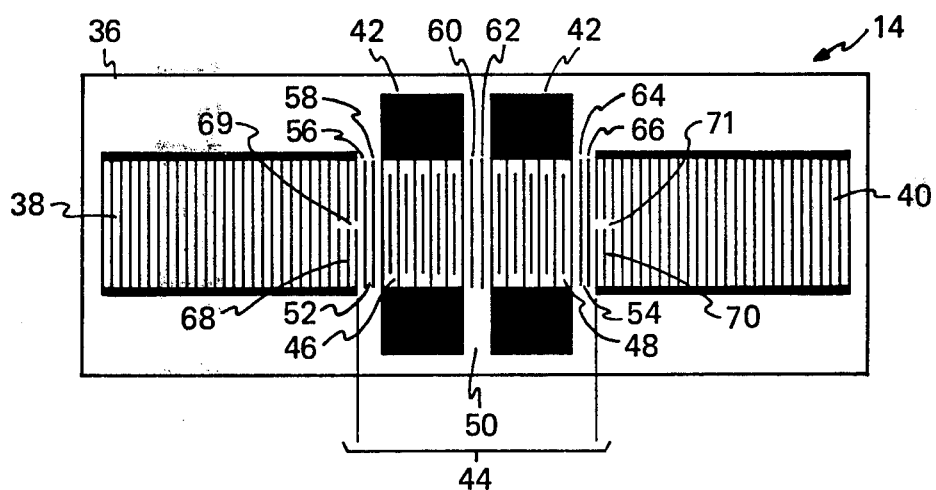
FIG 7 is a schematic diagram illustrating an alternative trimming pattern according to the present invention.

As will be appreciated by those skilled in the art the deposition of metallization strips in the gaps between reflecting gratings and transducers and between transducers changes the SAW device resonance frequency from that of the SAW device without the trimming strips, so that the initial frequency is that of a SAW device modified by the addition of the frequency trimming strips. In the case of added aluminum strips on a quartz substrate, the device resonance frequency is increased by the addition of metallizations. An alternative trimming pattern is illustrated in FIG. 7. Here small portions at 69 and 71 of metal strips 68, and 70 of reflecting gratings 38, 40, respectively, are removed to produce a frequency shift downward from the SAW device resonance frequency. If trimming is done at the ends of strips 68, 70 a frequency increase is achieved. The trimming could be done at other positions in the gratings, but by trimming in the wave propagation area near gaps 52, 54, improved sensitivity is provided. The present invention, therefore, can be used to either increase or decrease the resonance frequency of a SAW resonator and provides considerable flexibility in selecting SAW device resonance frequencies. Further, since the present invention employs continuous monitoring of resonance frequency during trimming, frequency control sensitivity is high.

Figure 8:
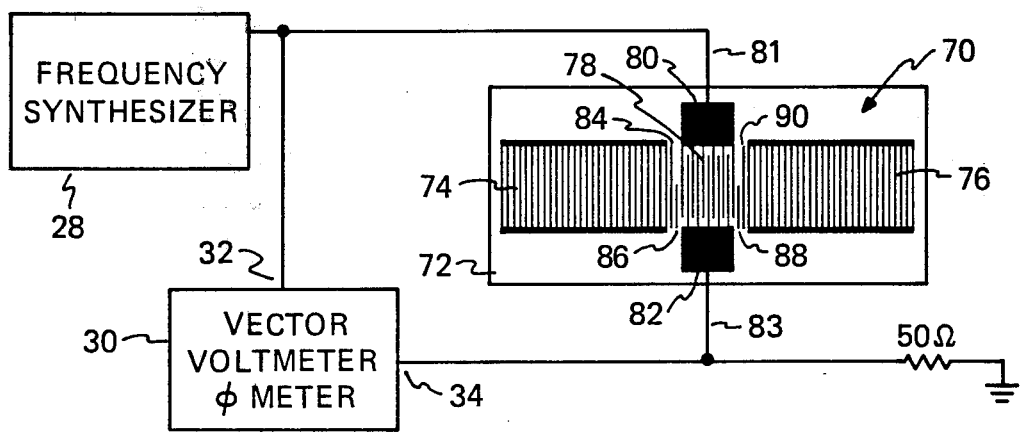
FIG. 8 is a schematic diagram illustrating an alternate embodiment of the present invention.

One port SAW devices may also be trimmed by the technique of the present invention. A one port device, such as that shown at 70 in FIG. 8, includes a planar substrate 72, reflecting gratings 74, 76 and a single transducer 78 having terminals 80, 82 mounted on one major surface of substrate 72. Metal trimming strips 84, 86, 88 and 90 are deposited as described above, and resonator 70 is connected to the frequency synthesizer 28 via line 81 and vector voltmeter phase meter 30. As in the previously described cases, the resonance frequency of the device 70 is measured prior to trimming, the desired frequency is set on the frequency synthesizer 28 and the trimming strips 84, 86, 88 and 90 are removed by laser trimming until a desired phase is reached on the phase meter.

This invention is particularly useful in high-Q devices where precise frequency control is necessary. If a cascaded assembly of resonator devices is to be employed, the overall bandwidth may be broadened by slightly offsetting the resonance frequency of individual SAW resonators to produce a broad overall system bandwidth. For very high-Q requirements, each of a set of cascaded filters can be trimmed to the identical resonance frequency to achieve the maximum Q. The technique of the present invention can be used to trim other devices, such as frequency control elements for oscillator circuits or a SAW delay line oscillator whose center frequency is determined by the delay time between the interdigitated transducers. In a SAW delay line oscillator a strip of aluminum or other metal or dielectric placed in the propagation path will change the delay time slightly. Using laser trimming of this aluminum strip as described, the desired frequency or time delay can be obtained by trimming off portions of the strip while monitoring the frequency.

As will be appreciated by those skilled in the art, the present invention provides a technique for very precisely controlling the operating frequency of surface acoustic wave devices for a variety of uses without requiring expensive and complicated processing techniques, and without risking damage to the elements of the device itself.

We claim:

1. A method of frequency trimming surface acoustic wave devices having a pair of reflecting gratings and a pair of interdigitated transducers located in a resonance cavity comprising the steps of:

(a) depositing a plurality of frequency trimming metallizations in gaps separating said reflecting gratings from said transducers;
(b) measuring the resonance frequency of said SAW device;
(c) removing a portion of at least one of said plurality of metallizations from said SAW device by laser vaporization to alter said resonance frequency until a desired predetermined operating frequency is achieved.

2. The method of claim 1 wherein step (a) comprises:
depositing a plurality of narrow strips of metal in said gaps; said strips being deposited in parallel relationship to the metal strips forming said reflecting gratings.

3. The method of claim 2 wherein step (b) comprises:
connecting one terminal of one transducer of said SAW device to a frequency synthesizer and one terminal of a vector voltmeter phase meter and connecting a terminal of the other transducer to a second terminal of said vector voltmeter phase meter; and
adjusting said frequency synthesizer to produce a predetermined phase reading of said vector voltmeter phase meter to indicate the resonance frequency of said SAW device.

4. The method of claim 3 wherein step (a) further comprises:
depositing a plurality of frequency trimming metallizations in a gap separating said transducers of said pair of transducers from each other.

5. The method of claim 4 wherein step (c) comprises:
setting a predetermined frequency in said frequency synthesizer equal to said desired frequency of said SAW device; and
removing metal from said frequency trimming metallizations until a predetermined phase is reached on said vector voltmeter phase meter, connected to said frequency synthesizer.

6. The method of claim 5 wherein step (a) comprises: depositing aluminum strips on a quartz substrate.

7. A method of frequency trimming surface acoustic wave devices having a pair of reflecting gratings and an interdigitated transducer located in a resonance cavity comprising the steps of:

(a) depositing a plurality of metal frequency trimming strips in gaps separating said reflecting gratings from said transducers;
(b) measuring the resonance frequency of said SAW device; and
(c) removing a portion of at least one of said plurality of metallizations from said SAW device by laser vaporization to alter said resonance frequency until a desired predetermined resonance frequency is achieved.

* * * * *